United States Patent [19]

Shahriary

[11] Patent Number: 4,727,319

[45] Date of Patent: Feb. 23, 1988

[54] APPARATUS FOR ON-WAFER TESTING OF ELECTRICAL CIRCUITS

[75] Inventor: Iradj Shahriary, Santa Monica, Calif.

[73] Assignee: Hughes Aircraft Company, Los Angeles, Calif.

[21] Appl. No.: 813,179

[22] Filed: Dec. 24, 1985

[51] Int. Cl.[4] ............................................. G01R 1/067
[52] U.S. Cl. .......................... 324/158 P; 324/158 F; 324/72.5
[58] Field of Search ................ 324/158 P, 158 F, 149, 324/73 PC, 73 AT, 72.5; 339/108 TP

[56] References Cited

U.S. PATENT DOCUMENTS

| 4,523,144 | 6/1985 | Okubo et al. | 324/158 P |
| 4,544,888 | 10/1985 | Kvaternik | 324/158 F |
| 4,566,594 | 1/1986 | Sleger et al. | 324/158 F |
| 4,574,235 | 3/1986 | Kelly et al. | 324/158 F |
| 4,574,236 | 3/1986 | Hechtman | 324/73 PC |

OTHER PUBLICATIONS

"A Microwave Prober for MMIC Chips", by Wilson, Abstracts of 1982 GaAs IC Symposium, pp. 156-159.
"Conductive Epoxy Encapsulated Wafer Probe", Valentine et al, 4/1978, IBM Tech. Disc. Bull., vol. 20, #11B, pp. 4797-4798.
"A Neutron Hardness Assurance Screen Based on High-Frequency Probe Measurements", Bailey et al, IEEE Transact. on Nuclear Science, vol. NS-23, #6, pp. 2020-2023.
"Microcircuitry Test Probe", by Jennicke et al, IBM Tech. Disc. Bull., vol. 12, #9, 2/70, p. 1435.
"High Voltage Probe for Liquid Immersion", by Harris, Rev. Sci. Instrum., vol. 45, #7, 7/74, pp. 961-962.

*Primary Examiner*—Reinhard J. Eisenzopf
*Assistant Examiner*—W. Burns
*Attorney, Agent, or Firm*—S. M. Mitchell; M. J. Meltzer; A. W. Karambelas

[57] ABSTRACT

A probe apparatus is provided for on-wafer testing of an electrical circuit, the probe apparatus comprising a base plate formed from an electrically conductive material, the base plate including top and bottom surfaces; a substrate formed from a dielectric material, the substrate including top and bottom surfaces, the top surface of the substrate being electrically connected to the bottom surface of the base plate; at least one microstrip transmission line secured to the bottom surface of the substrate, the microstrip line including a first end and a second end; a coaxial connector including a center conductor in electrical contact with the first end of the microstrip transmission line; and a needle probe electrically connected to the second end of the microstrip transmission line, the needle probe extending in a direction substantially away from the base plate.

5 Claims, 7 Drawing Figures

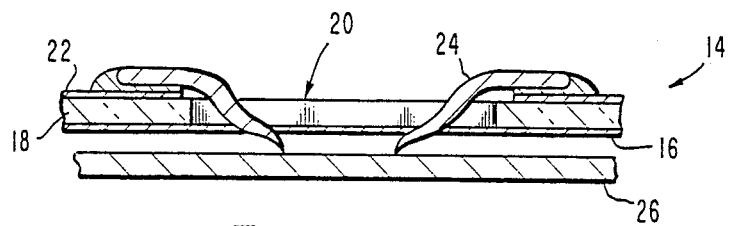
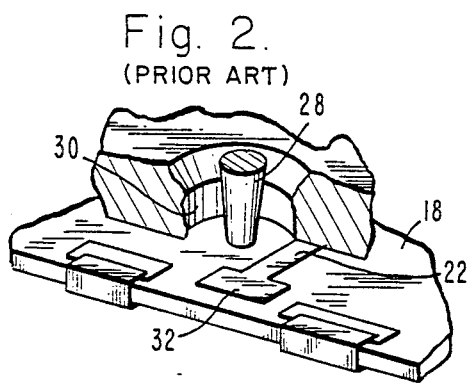
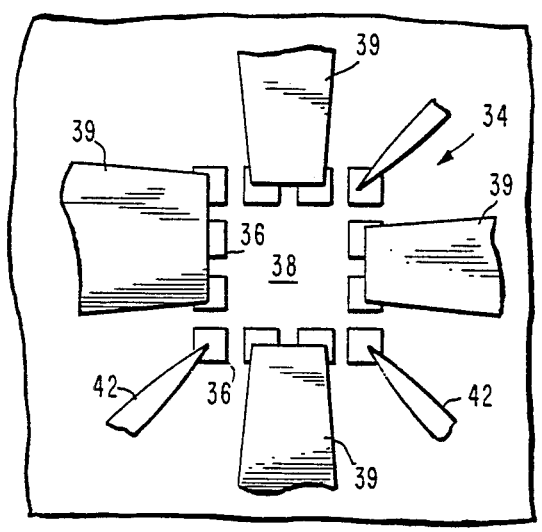

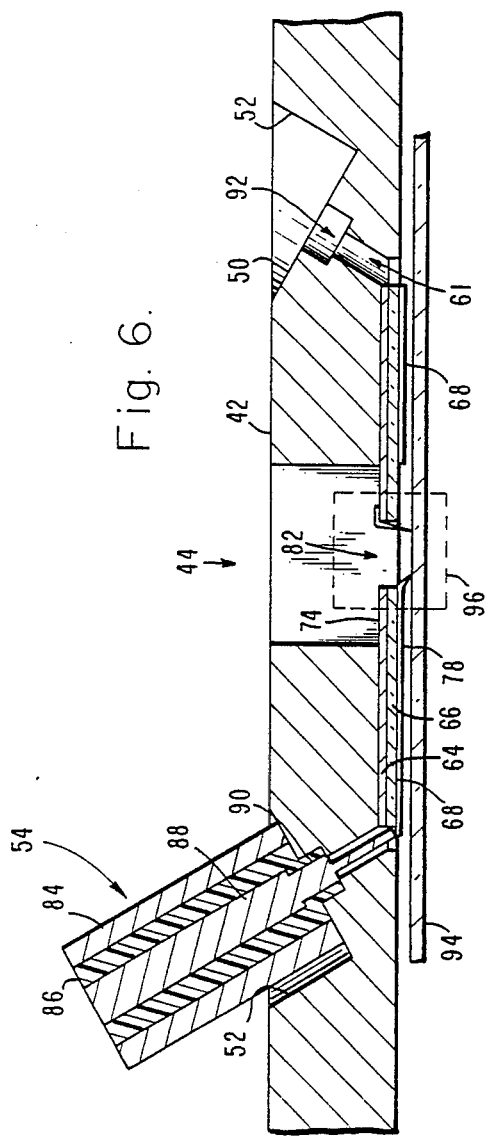
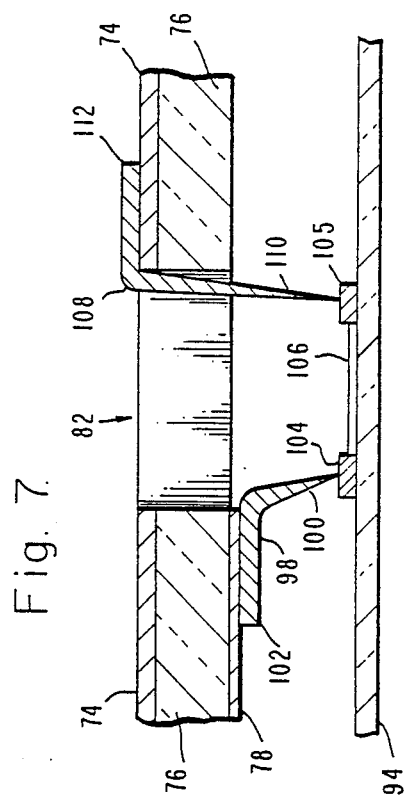

APPARATUS FOR ON-WAFER TESTING OF ELECTRICAL CIRCUITS

BACKGROUND OF THE INVENTION

1. Field of the Invention

The invention relates to devices for testing electronic circuits, and more particularly, to devices for on-wafer testing of electronic circuits.

2. Description of the Related Art

The large scale production of physically small electronic circuits from semiconductor materials has created a need for economical methods for manufacturing and testing such circuits. Typically, the manufacturing process involves the formation of many discrete electronic circuits from a thin wafer of semiconductor material. After formation of the individual circuits, the wafer is sliced to separate individual circuits so that they can be individually sealed in protective packages for distribution and sale.

Due to the possibility of manufacturing defects which could render individual electronic circuits unacceptable for their intended uses, it is desirable to test each electronic circuit prior to distribution and sale. Furthermore, because the packaging of individual circuits can involve relatively delicate, complex and expensive procedures, it is desirable to test the circuits prior to packaging in order to identify defective circuits and eliminate them from the packaging procedures. Therefore, such electronic circuits often are tested while still integrally attached to the semiconductor wafer on which they were formed.

The advent of increasingly high frequency electronic circuits which can operate at frequencies extending into the gigahertz range has spurred the development of test equipment for on-wafer testing of such high frequency circuits at or near their operating frequencies. The equipment usually includes a probe apparatus for conducting electrical test signals between metallized pads on the wafer adjacent to an electronic circuit being tested and an electronic network for analyzing such signals. A recurrent problem in constructing such a probe apparatus stems from the fact that at very high frequencies, unshielded transmission lines can behave as inductances, blocking electronic signals and thus inhibiting the high frequency testing of electronic circuits.

A first earlier probe apparatus for on-wafer testing of electronic circuits at frequencies in the gigahertz range is illustrated in FIGS. 1 and 2. Referring to FIG. 1, the first earlier probe apparatus (14) comprises a metal base layer (16) overlayed by a dielectric layer (18). An aperture (20) extends through the metal base layer (16) and the dielectric layer (18). Microstrip transmission lines (22) reside upon the dielectric layer (18) and extend to a region adjacent to the aperture (20); whereupon, respective needle probes (24) in electrical contact with respective microstrip transmission lines (22) extend from their respective microstrip transmission lines (22) through the aperture (20) and make electrical contact with an electronic circuit disposed on a semiconductor wafer (26) beneath the first apparatus (14).

FIG. 2 illustrates further aspects of the first earlier apparatus (14). More specifically, there is shown an electrical transition between a center conductor (28) of a coaxial transmission line and the microstrip transmission line (22). It will be understood that signals often are conducted between the first probe apparatus (14) and electric networks (not shown) for analyzing such signals by coaxial transmission lines, and signals are conducted between such coaxial transmission lines and the needle probles (24) by microstrip transmission lines (22). The center conductor (28) is substantially housed within a cylindrical outer conductor shield (30) and is urged against an enlarged region (32) of the microstrip transmission line (22) by a small spring (not shown).

FIG. 3 depicts aspects of a second earlier probe apparatus (34) for conducting electrical test signals between metallized pads (36) adjacent to a wafer-mounted electrical circuit (38) and an electronic network (not shown) for analyzing such signals. The second earlier probe apparatus (34) comprises a plurality of probes (39) formed from a dielectric material. The dielectric probes (39) enclose transmission lines (not shown) which conduct test signals between conductive probe needles (not shown) which depend from the probes (39) and are in electrical contact with the metallic pads (36). The probes (39) both support the transmission lines and the probe needles and provide electrical shielding to the transmission lines. Additionally, grounding probes (42) in electrical contact with certain metallic pads (36) provide electrical grounding during test procedures.

While earlier devices for high frequency on-wafer testing of electronic circuits generally have been successful, there have been limitations on their use. For example, despite the relatively small dimensions of the unshielded needle probes (24) of the first earlier probe apparatus (14), the needle probes (24) still are long enough to experience inductance which can inhibit the accurate testing of electronic circuits which operate above certain relatively high frequencies. Additionally, the geometry of the enlarged region (32), illustrated in FIG. 2, where the center conductor (28) makes electrical contact with the microstrip transmission line (22) may result in poor impedance matching.

Furthermore, although the second earlier apparatus (34) illustrated in FIG. 3 generally features shorter needle probes (not shown) which permit relatively accurate on-wafer testing of electronic circuits even at relatively high frequencies, the probes (39) generally are not easily modified to test different electronic circuits having different numbers and arrangements of metallic pads (36). Additionally, the probes (39) are relatively bulky, and each probe (39) can effectively enclose only a limited number of transmission lines. Thus, for example, where a relatively small electronic circuit surrounded by a relatively large number of metallic pads is to be tested, there may be insufficient space adjacent to such an electronic circuit to bring enough needle probes into electrical contact with the metallic pads to perform accurate testing. These limitations in the use of the second earlier probe apparatus (34) can prove to be drawbacks when, for example, it is desired to perform on-wafer high frequency tests of a variety of integrated electronic circuits having different numbers and arrangements of metallic pads.

Thus, there has been a need for a test probe apparatus for improved on-wafer testing of electronic circuits. The test probe apparatus should be capable of performing accurate testing of high frequency circuits at operational frequencies well into the gigahertz frequency range and should be flexible enough to be easily modified to test a variety of different electronic circuits having relatively large numbers and varied arrangements of metallic pads. The present invention meets this need.

SUMMARY OF THE INVENTION

In a presently preferred embodiment, the probe apparatus comprises a base plate formed from an electrically conductive material. The base plate includes top and bottom surfaces and, for example, may be formed from a block of metal. A layer of dielectric material is secured to the bottom surface of the base plate, and at least one microstrip transmission line is secured to a bottom surface of the dielectric layer. The microstrip transmission line includes two ends. A center conductor of a coaxial connector is in electrical contact with one end of the microstrip transmission line, and a needle probe is electrically connected to another end of the microstrip transmission line, the needle probe extends from the microstrip transmission line in a direction substantially away from the base plate.

In a further aspect of the invention, an outer shield of the coaxial connector is electrically connected to the base plate, and the base plate defines a conduit through which extends an end segment of the center conductor which substantially abuts the microstrip transmission line. Furthermore, the center conductor, the microstrip transmission line, the conduit and the dielectric layer are proportioned to provide a relatively smooth well matched electrical transition from coaxial to microstrip transmission line. Thus, relatively good impedance matching is provided.

The novel probe apparatus of the present invention therefore provides relatively short needle test probes which can conduct test signals at relatively high frequencies without suffering substantial losses due to inductance. Furthermore, since relatvely small needle test probes are used, a relatively large number of them can be brought into close proximity to electrical circuits to be tested. Finally, the new probe apparatus provides an electrical transition from coaxial to mircrostrip transmission line in which impedances can be relatively well matched.

These and other features and advantages of the present invention will become more apparent from the following detailed description of an exemplary embodiment thereof, as illustrated in the accompanying drawings.

BRIEF DESCRIPTION OF THE DRAWINGS

The purpose and advantages of the present invention will be apparent to those skilled in the art from the following detailed description in conjunction with the appended illustrative drawings in which:

FIG. 1 is a cross-sectional view of a portion of a first earlier probe apparatus;

FIG. 2 is a perspective partially fragmented view of an electrical transition from coaxial to microstrip transmission line of the first earlier probe apparatus of FIG. 1;

FIG. 3 is a top elevation view of a portion of a second earlier probe appratus;

FIG. 6 is a cross-section view along line 6—6 of FIG. 4; and

FIG. 7 is an enlarged view illustrating details of FIG. 6.

DETAILED DESCRIPTION OF THE PREFERRED EMBODIMENT

The present invention provides a novel probe apparatus for on-wafer testing of elctrical circuits. The following description is presented to enable any person skilled in the art to make and use the invention, and is presented in the context of a particular application and its requirements. Various modifications and improvements to the preferred embodiment will be readily apparent to those skilled in the art, and the generic principles herein may be applied to other embodiments and applications. Thus, the present invention is not intended to be limited to the embodiment shown, but it is to be accorded the widest scope consistent with the principles and features disclosed herein.

Figure 4:
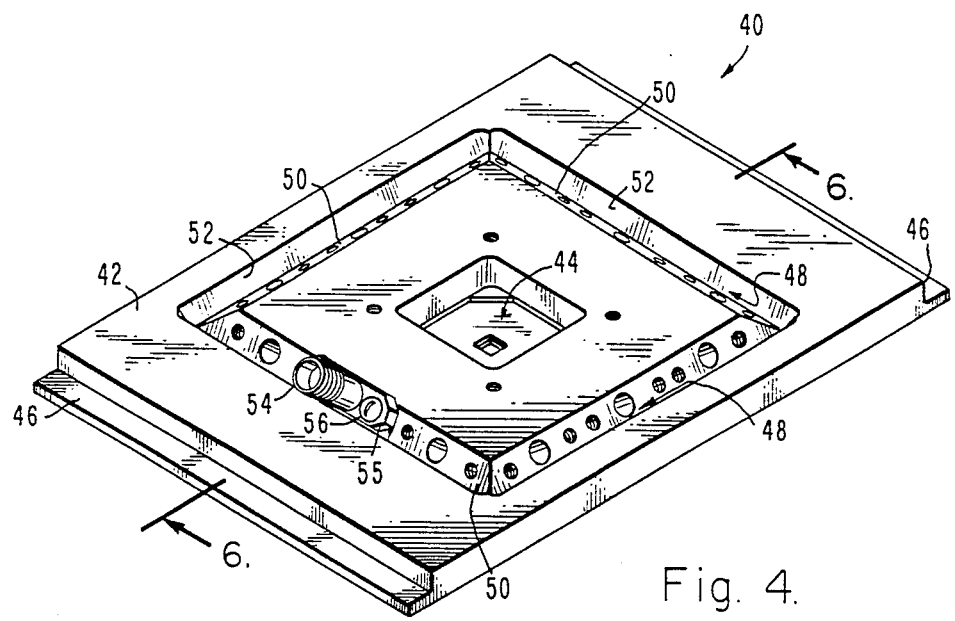
FIG. 4 is a perspective top view of a presently preferred embodiment of a probe apparatus of the present invention.
Figure 5:
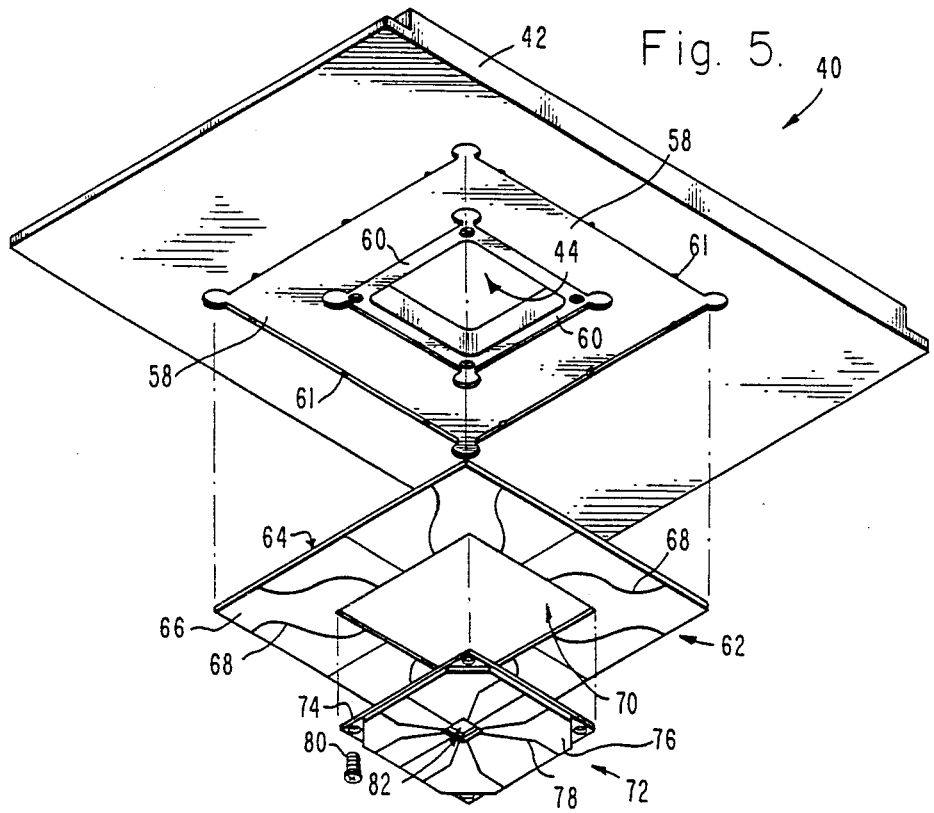
FIG. 5 is a perspective partially exploded bottom view of the embodiment of FIG. 4.

Referring to FIGS. 4 and 5, illustrative drawings are provided of the novel probe apparatus (40) of the present invention. The probe apparatus (40) comprises a rectangular carrier plate (42) defining a rectangular openning (44) through the center thereof. The carrier plate (42) includes first and second flanges (46) extending along perimeters of opposite outer sides thereof. The first and second flanges (46) are suitable for firm attachment of the carrier plate (42) to a test jig (not shown) during circuit testing.

The carrier plate (42) defines a groove (48) formed in a top surface thereof as, for example, by machining. The groove (48) comprises four straight intersecting groove segments which together define a substantially rectangular path. The groove (48) is bounded by respective inner and outer wall segments (50) and (52), each of which are inclined and non-orthogonal relative to a plane of the top surface of the carrier plate (42).

Twelve substantially identical coaxial connectors (54) (only one of which is shown) are secured to the carrier plate (42). More specifically, each respective coaxial connector (54) includes a pair of integral flanges (55) extending in opposite directions from one end thereof. The respective integral flanges (55) rest upon respective inner wall segments (50). Furthermore, each respective inner wall segment (50) is inclined at an angle of approximately forty-five degrees relative to the plane of the top surface of the carrier plate (42). Three coaxial connectors (54) are secured at substantially equal intervals along each inner wall segment (50). In the preferred embodiment, for example, the respective coaxial connectors (54) are secured to the respective inner wall segments (50) by screws (56) inserted through the integral flanges (55).

It will be appreciated that a respective central axis of each respective coaxial connector (54) is inclined at an angle of approximately forty-five degrees relative to the plane of the top surface of the carrier plate (42). Furthermore, it will be understood that the respective outer wall segments (52) are inclined and nonorthogonal relative to the aforementioned plane such that adequate spacing is provided between respective opposed inner and outer wall segments (50) and (52) to accommodate the respective inclined coaxial connectors (54).

The carrier plate (42) is formed from an electrically conductive material such as aluminum or brass which is sturdy enough to provide dimensional stability.

Referring now to the drawings of FIG. 5, there is provided a partially exploded bottom view of probe apparatus (40) of the present invention. First and second rectangular concentric recessed regions (58) and (60), respectively, are formed in a bottom surface of the carrier plate (42) about the rectangular openning (44). The first recessed region (58) surrounds the second recessed region (60) and is less deeply recessed than the second recessed region (60). Respective perimeters of each recessed region (58) and (60) are aligned with one-other and with a perimeter of the rectangular openning (44) such that all three substantially share a common diagonal. Twelve conduits (61), each one corresponding to a respective coaxial connector (54), open through the bottom surface of the carrier plate (42) immediately adjacent to an outer perimeter of the first recessed region (58). The conduits (61) are distributed three to a side about the outer rectangular perimeter and are spaced apart from one-another at substantially equal intervals.

A mother board (62) fits flush within the first recessed region (58). The mother board (62) comprises a thin dielectric layer (66) formed from a material such as alumina or quartz. The dielectric layer (66) has microstrip transmission lines (68) disposed thereon such that a metallic electrical ground layer (64) resides on an upper surface of the dielectric layer (66).

The metallic electrical ground layer (64) of the mother board (62) is secured to the carrier plate (42) by suitable means such as, for example, silver epoxy. The thickness of the dielectric layer (66) is approximately 0.010 inches, and the thickness of the metallic electrical ground layer (64), which provides dimensional stability, is selected such that a bottom surface of the dielectric layer (66) is substantially flush with a bottom surface of the carrier plate (42). The width of each microstrip transmission line is approximately 0.010 inches.

Each respective microstrip transmission line (68) includes a first end which is disposed immediately adjacent to a respective conduit (61), and the corresponding microstrip transmission line (68) extends from that conduit (61) to a perimeter of a mother board openning (70) which is sized and contoured to follow a perimeter of the second recessed region (60).

An interchangeable insert board (72) fits flush within the second recessed region (60) within the mother board openning (70). The insert board (72) is a thin laminated structure comprising a metallic upper insert layer (74) which, for example, can be formed from the same conducting material as the carrier plate (42). It also includes a dielectric insert layer (76) formed from a dielectric material such as alumina or quartz. Finally, microstrip transmission lines (78) are formed in a conventional manner. It will be appreciated that the metallic upper insert layer (74) provides electrical grounding and is thick enough to provide structural support for the insert board (72).

The thickness of the dielectric insert layer (76) is approximately 0.010 inches, and the thickness of the metallic upper insert layer (74), which provides dimensional stability, is selected such that a bottom surface of the dielectric insert layer (76) is substantially flush with the bottom surface of the dielectric layer (66) of the mother board (62). Each individual microstrip transmission has a width of approximately 0.010 inches.

The insert board (72) is removably secured to the carrier plate (42) by suitable means such as by screws (80). Thus, the insert board (72) selectively can be removed and a different insert board (not shown) can be substituted as necessary.

In the embodiment depicted in FIG. 5, the insert board (72) includes ten microstrip transmission lines (78). Each respective microstrip transmission line (78) extends from an outer perimeter of the insert board (72) whereupon it substantially abuts against and makes electrical contact with a respective of the microstrip transmission lines (68) of the mother board (62), and each respective line (78) extends substantially to a periphery of a viewing port (82) defined by the insert board (72). Thus the respective microstrip transmission lines (68) and (78) of the respective mother board (62) and insert board (72), in the embodiment illustrated in FIG. 5, define ten respective microstrip transmission line paths (68, 78) each including a first end adjacent to a respective conduit (61) and a second end adjacent to the periphery of the central rectangular aperture (82). It will be understood that a different insert board (not shown) may be inserted as necessary to provide either more or less transmission line paths.

The respective second ends of the microstrip transmission line paths (68, 78) may be electrically coupled to respective needle probes which depend from the periphery of the viewing port (82) as will described in more detail below.

From the drawings of FIGS. 6 and 7, one will understand that during testing, the probe apparatus (40) is lowered to a position above a semiconductor wafer (94) bearing an electric circuit under test. As will be more fully described below, respective needle probes (98, 108) are brought into electrical contact with appropriate regions (104, 105) on the surface of the wafer (94) so that electrical test signals can be conducted between the wafer (94) and the probe apparatus (40).

FIG. 6 illustrates an electrical transition from a respective coaxial connector (54) to a respective microstrip transmission line path (68, 78). In the presently preferred embodiment, the twelve coaxial connectors (54) each comprise a cylindrical outer conductor (84), a cylindrical center conductor (88) and a layer (86) of a dielectric material, such as the material known by the trade name Teflon, disposed therebetween. The coaxial connectors (54), for example, may be a conventional type known in the trade as SMA connectors which are produced by Microwave Associates which has a place of business at Burlington, Mass. The details of such connectors are well known and need not be described herein.

The center conductor (88) of each respective coaxial connector (54) protrudes beyond an end of its cylindrical outer conductor (84) adjacent to the inner wall segment (50) upon which the connector (54) rests. More specifically, a respective cylindrical dielectric segment (90) formed from the coaxial connector dielectric material extends beyond the end of each individual connector (54), and a respective center conductor (88) extends through the center of the cylindrical dielectric segment (90) and protrudes beyond a distal end thereof.

Twelve respective cylindrical recesses (92) are formed, for example, by machining in an inner wall segment (50). The cylindrical recesses (92) are sized to receive and to provide a snug interfit about a respective cylindrical dielectric segment (90). The depth of each such recess (92) is selected such that a respective outer conductor (84) and its corresponding integral flanges (55) abut against respective inner wall segments (50) wherein the recess (92) is formed.

A respective conduit (61) extends from a bottom of each respective cylindrical recess (92) and through the carrier plate (42) to the outer rectangular perimeter of the first recessed region (58) as described above. Each individual center conductor (88) includes a protruding end segment which extends through a respective conduit (61) and substantially abuts against and makes an electrical connection with a first end of a corresponding microstrip transmission line path (68,78).

Thus, in the preferred embodiment, twelve conduits (61) extend through the carrier plate (42). Each conduit (61) has a diameter which measures approximately 0.030 inches. The protruding end segment portion of each center conductor (88) measures approximately 0.010 inches in diameter. Therefore, there is a diametric distance of approximately 0.010 inches between an outer surface of each such end segment portion and carrier plate walls defining a corresponding conduit (61).

Furthermore, it will be appreciated that the protruding end portions of each of the center conductors (88) are inclined at angles of approximately forty-five degrees relative to the plane of the top surface of the carrier plate (42) because of the above-described inclination of the respective inner wall segments (50). Of course, the paths of the respective conduits (61) are similarly inclined.

The respective protruding end portions of the center conductors (88) which abut against and make electrical connections with first ends of corresponding microstrip transmission line paths (68, 78) are secured to such first ends, for example, by soldering or by the application of a suitable conductive bonding agent such as silver epoxy. Although in some instances the mere abutting contact between the protruding end portions and the first ends of the transmission line paths (68, 78) may provide adequate electrical connection without the need for soldering or the application of a conductive bonding agent.

The carrier plate (42) is coated with a conductive coating such as gold plating. The respective metallic upper layers (64,74) also are coated with a conductive coating such as gold plating.

Thus, top surfaces of the respective dielectric layers (66,76) are in electrical contact with bottom surfaces of the metallic layers (64, 74), and the respective outer conductors (84) and the integral flanges (55) are in electrical contact with carrier plate (42). Furthermore, the metallic layers (64, 74) and the carrier plate (42) are in electrical contact with one another. Therefore, the metallic layers (64, 74), the carrier plate (42) and the respective outer conductors (84) all can be maintained at electrical ground during testing procedures.

It will be appreciated that the width of each respective microstrip transmission line path (68, 78) is substantially equal to the diameter of the protruding end portion of each respective center conductor (88)—(0.010 inches). Likewise, the vertical spacing—0.010 inches- between each microstrip transmission line path (68, 78) and the top surface of the dielectric layer (66, 76), which is maintained substantially at electrical ground during testing, is substantially equal to the radial spacing between the protruding end portion of each respective center conductor (88) and the walls defining the corresponding conduits (61), such walls, of course, also being maintained substantially at electrical ground during testing.

Thus, a relatively smooth electrical transition from coaxial to microstrip transmisison lines is provided in which there is relatively good impedance matching. Furthermore, this transition is achieved substantially without any portion of a center conductor (88) protruding significantly beneath the bottom surface of the dielectric layer (66, 76), which is important because the bottom surface is relatively close to the wafer (94) during testing procedures. Also, this transition is provided substantially without the need for a mechanical device, such as a spring, to urge the center conductor (88) into physical contact with the microstrip transmission line path (68,78).

Referring now to the illustrative drawing of FIG. 7, details are shown of the probe apparatus (40) within dashed lines labelled (96) in FIG. 6. More particularly, a needle test probe (98) is illustrated. The needle test probe (98) includes a round shank, a sharp end (100) and a blunt end (102). The shank is bent at approximately a sixty degree angle near the sharp end (100) such that the sharp end extends in a direction generally away from the dielectric layer (76) and toward a metallic test pad (104) located near a periphery of an electronic circuit (106) formed on the wafer (94). A segment of the shank of each respective needle test probe (98) adjacent to its blunt end (102) is secured to a respective microstrip transmission line (78) near the periphery of the viewing port (82) such that the sharp end (100) of each respective needle test probe (98) is in electrical contact with a metallic test pad (104) when the probe apparatus (40) is lowered over an electrical circuit (106) during testing. The shank of the needle test probe (98), for example, can be secured to the corresponding microstrip transmission line, for example, (78) by soldering.

Furthermore, FIG. 7 illustrates a grounding probe (108) which also depends through the viewing port (82) and which provides an electrical path between the gold plated upper surface of the dielectric layer (76) and a metallic grounding pad (105) secured to the wafer (94) near the periphery of an electronic circuit (106). The grounding probe (108) also has a circular shank and a sharp end (110) and a blunt end (112). A segment of the shank adjacent to the blunt end (112) is secured to the metallic upper layer (74), and the grounding needle (108) is bent at approximately a sixty degree angle such that the sharp end (110) extends in a direction generally toward a respective grounding pad (105) beneath the probe apparatus (40) during testing. The shank of the grounding needle, for example, can be secured to the metallic upper layer (74), for example, by soldering.

The respective needle test probes (98) and grounding needles (108) have respective sharp ends (100) and (110) which are substantially coplanar and which extend approximately 0.015 inches beneath a lower surface of the dielectric layer (76). The respective needle test probes (98) and grounding needles (108) have diameters of approximately 0.001 inches near the centers of their respective shanks. Thus, the respective needle test probes (98) and grounding needles (108), are relatively delicate and compliant. If their respective sharp ends (100) or (110) are not exactly coplanar, respective individual needle test probes (98) or grounding needles (108) which are slightly longer or which otherwise extend farther below the dielectric layer (76) will flex as necessary upon making physical contact with their respective test pads (104) or grounding pads (105) to permit respective shorter needle test probes (98) or grounding needles (108) to make electrical contact with their respective test pads (104) or grounding pads (105).

Thus, the present probe apparatus (40) provides respective needle test probes (98) which extend substantialy from the bottom surface of the dielectric layer (76) to respective test pads (104). Since the distance between the bottom surface of the dielectric layer (76) and a respective test pad (104) is relatively short, the respective needle test probes (98) also can be relatively short. It will be appreciated that shorter needle test probes (98) can conduct electrical test signals at substantially higher frequencies without experiencing significant inductance losses. Furthermore, since the individual respective needle test probes (98) are physically relatively small, a relatively large number of them can be provided to make electrical contact with respective metallic test pads (104).

Therefore, an electrical path for the transmission of electrical test signals between respective coaxial connectors (54) and respective needle test probes (98) is provided by the respective microstrip transmission line paths (68, 78) each of which extends substantially from respective conduits (61) to the viewing port (82). The microstrip tranmission line paths (68, 78) provide shielding which substantially prevents inductance losses during transmission of electrical test signals between coaxial connectors (54) and the needle test probes (98). Since microstrip transmission line paths (68, 78) are relatively lossy, however, their total length should be relatively short.

It will be understood that, in a particular application, the number of needle test probes (98) and grounding needles (108) and their distribution about the viewing port (82) will be determined by the number and the layout of respective metallic test pads (104) and metallic grounding pads (105) about an electronic circuit (106) on a wafer (94) under test. For example, an insert board (72) can be selected or can be custom-built to test wafer-mounted electronic circuits having a particular number and arrangement of metallic test pads and metallic ground pads. For example, referring to FIGS. 4 and 5, although the preferred embodiment is adapted to include twelve coaxial connectors (54), only ten microstrip transmission lines (78) are formed on the insert board (72) illustrated in FIG. 5. Thus, an electronic circuit which might be tested using an insert board (72) such as that illustrated in FIG. 5 would not make use of at least two of the available coaxial connectors (54). Other alternative insert boards (72) (not shown) could be built, however, which comprise twelve microstrip transmission lines (78) and could easily be substituted in place of the insert board (72) shown in FIG. 5.

Finally, the dimensions and contour of the viewing port (82) advantageously can be selected so as to substantially follow the contour of the periphery of an electrical circuit (106) to be tested which may be, for example, irregular in shape. Since the viewing port (82) follows the contour of the circuit under test, the probes (98, 108) advantageously can be shorter in length. It will be appreciated that the small dimensions of the needle test probes (98) and the grounding probes (108) and as well as those of the electronic circuit (106) tested may require the use of a microscope (not shown) in order to view adequate details through the viewing port (82).

Therefore, the probe apparatus (40) of the present invention can be used to effectively perform on-wafer electrical testing of electrical circuits at or near operational frequencies extending significantly into the gigahertz range. By securing the needle test probes (98) to microstrip transmission line paths (68, 78) formed on a bottom surface of a dielectric layer (66,76) of the probe apparatus (40), relatively short needle test probes (98) can be used. Shorter needle test probes (98) generally are less susceptible to inductance losses at such high frequencies. Furthermore, since the needle test probes (98) physically are relatively small, a substantially large number of them can be brought into close physical proximity with an electrical circuit (106) under test.

Finally, the present invention provides a probe apparatus (40) in which the electrical transition from coaxial line to microstrip transmission line exhibits relatively good impedance matching.

It will be understood that the embodiment described above is merely illustrative of many possible specific embodiments which can represent the principles of the invention. Numerous and varied other arrangements can readily be devised in accordance with these principles without departing form the spirit and scope of the invention. Thus, the foregoing description is not intended to limit the invention which is defined by the appended claims in which:

What is claimed is:

1. A probe apparatus for on-wafer testing of an electrical circuit, said probe apparatus comprising:
   a base plate formed from an electrically conductive material, said base plate including top and bottom surfaces and defining an aperture extending therethrough, said base plate further defining a plurality of respective substantially cylindrical conduits;
   a substrate formed from a dielectric material, said substrate including top and bottom surfaces, the top surface of the substrate being electrically connected to the bottom surface of the base plate, said substrate defining an aperture therethrough, the apertures defined by said base plate and said substrate being aligned and sized to permit viewing therethrough;
   a plurality of respective microstrip transmission lines secured to the bottom surface of said substrate, each respective microstrip transmission line having a first end and a second end, each second end being disposed adjacent to the aperture defined by said substrate;
   a plurality of respective coaxial connectors, each including an outer conductor in electrical contact with said base plate and each including a corresponding center conductor having diameter substantially equal to the width of a respective microstrip transmission line, each respective center conductor including a respective end segment which extends beyond its corresponding outer conductor and which depends within a respective one of the conduits and which is in electrical contact with a first end of a respective one of the microstrip transmission lines, the radial distance from the surface of each of said respective end segments to a wall defining a respective conduit being substantially equal to the thickness of said substrate; and
   a plurality of respective needle probes each electrically connected to a second end of a respective microstrip transmission line and extending in a direction substantially away from said base plate.

2. The apparatus of claim 1 wherein the width of each of said microstrip transmission lines substantially equals the thickness of said substrate.

3. The apparatus of claim 1 wherein each of said respective end segments is inclined at an angle relative to a transverse plane of said base plate.

4. The apparatus of claim 3 wherein the angle of inclination is substantially 45 degrees.

5. The apparatus of claim 1 wherein said base plate includes a recess for receiving a removable insert board;
   wherein said plurality of coaxial connectors are mounted on the base plate; and
   wherein said substrate, said plurality of microstrip transmission lines and said plurality of needle probes are mounted on said removable insert board.

* * * * *